United States Patent
Kadokura et al.

(10) Patent No.: US 9,025,626 B2
(45) Date of Patent: May 5, 2015

(54) SEMICONDUCTOR LASER EXCITED SOLID STATE LASER DEVICE AND LASER LIGHT OUTPUT METHOD

(71) Applicants: Kazutomo Kadokura, Kyoto (JP); Katsuhiko Tokuda, Kyoto (JP); Mamoru Hisamitsu, Kyoto (JP); Kazuya Inoue, Kyoto (JP)

(72) Inventors: Kazutomo Kadokura, Kyoto (JP); Katsuhiko Tokuda, Kyoto (JP); Mamoru Hisamitsu, Kyoto (JP); Kazuya Inoue, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 14/031,255

(22) Filed: Sep. 19, 2013

(65) Prior Publication Data

US 2015/0078407 A1    Mar. 19, 2015

(51) Int. Cl.
  *H01S 3/098* (2006.01)
  *H01S 5/06* (2006.01)
(52) U.S. Cl.
  CPC ............. *H01S 5/0612* (2013.01); *H01S 5/0604* (2013.01)
(58) Field of Classification Search
  CPC ......... H01S 3/00; H01S 3/0014; H01S 3/025; H01S 3/04; H01S 3/0401; H01S 3/0405; H01S 3/042; H01S 3/0606; H01S 3/09; H01S 3/0912; H01S 3/0933; H01S 3/102; H01S 3/1022; H01S 3/1026; H01S 3/109; H01S 3/1305; H01S 3/131; H01S 3/1317
  USPC ............................. 372/19, 22, 25, 30, 33–34
  See application file for complete search history.

(56) References Cited

U.S. PATENT DOCUMENTS 6,584,127 B2 * 6/2003 Matsumoto ..................... 372/34

FOREIGN PATENT DOCUMENTS

JP    2007-242974 A    9/2007

* cited by examiner

*Primary Examiner* — Dung Nguyen
(74) *Attorney, Agent, or Firm* — Sughrue Mion, PLLC

(57) ABSTRACT

A semiconductor laser excited solid state laser device and method. The device including a semiconductor laser; a driving device; a solid state laser module which has maximum output efficiency at the set temperature and which generates, from excitation light, an output light of a predetermined output level when the optical noise is at or below a fixed level and the output level of the excitation light is the set output level; a single temperature adjustment device which adjusts the temperature of the semiconductor laser and the temperature of the solid state laser module; and a control device which controls the driving device such that the output light will be at the predetermined output level and controls the temperature adjustment device such that the temperature of the semiconductor laser and the solid state laser module will be the set temperature.

9 Claims, 4 Drawing Sheets

Figure 1:
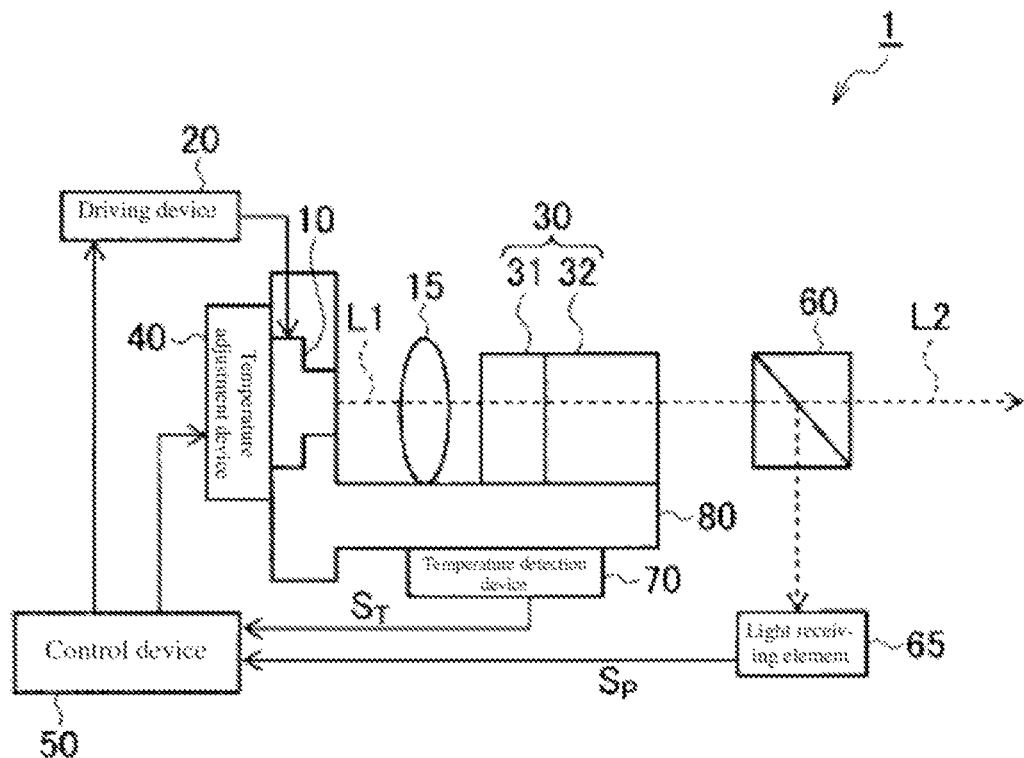

SEMICONDUCTOR LASER EXCITED SOLID STATE LASER DEVICE AND LASER LIGHT OUTPUT METHOD

CROSS-REFERENCE TO RELATED APPLICATIONS

The entire contents of Japanese Patent Publication No. 2012-234933 to the same inventors, published Nov. 29, 2012, are incorporated herein by reference.

TECHNICAL FIELD

The present invention relates to a semiconductor laser excited solid state laser device and laser light output method, comprising a semiconductor laser and solid state laser module temperature adjustment function.

BACKGROUND ART

Various developments have been advanced with regard to semiconductor laser excited solid state laser devices having a semiconductor laser which is the excitation light source and a solid state laser module which is excited by the semiconductor laser and generates output light. For example, a green laser pointer has been proposed wherein the power consumption is minimized through a single temperature adjustment configuration whereby temperature adjustment of the semiconductor laser and solid state laser module is carried out by means of a single temperature adjustment device, allowing portable use based on dry cell driving (for example, see Patent Literature 1).
(Prior Art Literatures)
(Patent Literatures)
(Patent literature 1) Japanese Unexamined Patent Application Publication 2007-242974

SUMMARY OF THE INVENTION

It is desirable for a semiconductor laser excited solid state laser device to output stable second harmonic generation light (SHG light) of low optical noise. Thus, the temperature of the semiconductor laser is set to a temperature at which mode hopping does not occur, and the temperature of the solid state laser module is set to a temperature at which the output efficiency of SHG light (hereinafter referred to as "SHG output efficiency") is high and optical noise is low.

Here, by performing individual temperature control of the semiconductor laser and the solid state laser module and setting the semiconductor laser and solid state laser module to the respectively optimal temperatures, it becomes possible to use a semiconductor laser excited solid state laser device which has been tuned so as to satisfy the above setting parameters.

However, providing temperature adjustment devices for the semiconductor laser and for the solid state laser module respectively causes the power consumption of the semiconductor laser excited solid state laser device to increase. Furthermore, in the case of a portable green laser pointer and the like, which employs a single temperature adjustment configuration in order to reduce power consumption, there is the problem that it is difficult to simultaneously optimize the setting parameters of the semiconductor laser and solid state laser module.

In view of the aforesaid problem, it is the object of the present invention to provide a semiconductor laser excited solid state laser device, and a laser light output method, which outputs stable SHG light of low optical noise and reduces power consumption.

In one aspect of the present invention, a semiconductor laser excited solid state laser device is provided, comprising (A) a semiconductor laser which outputs a single transverse mode excitation light of fixed wavelength at a set output level, without undergoing mode hopping, at a set temperature; (B) a driving device which drives the semiconductor laser; (C) a solid state laser module which has maximum output efficiency at the set temperature and which generates, from the excitation light, an output light of a predetermined output level when the optical noise is at or below a fixed level and the output level of the excitation light is the set output level; (D) a single temperature adjustment device which adjusts the temperature of the semiconductor laser and the temperature of the solid state laser module; and (E) a control device which controls the driving device such that the output light will be at the predetermined output level and controls the temperature adjustment device such that the temperature of the semiconductor laser and the solid state laser module will be the set temperature.

In another aspect of the present invention, a laser light output method is provided, comprising (A) a step of selecting a semiconductor laser which outputs a single transverse mode excitation light of fixed wavelength at a set output level, without undergoing mode hopping, at a set temperature; (B) a step of selecting a solid state laser module which has maximum output efficiency at the set temperature and which generates, from the excitation light, an output light of a predetermined output level when the optical noise is at or below a fixed level and the output level of the excitation light is the set output level; (C) a step of using the selected semiconductor laser and the selected solid state laser module and a single temperature adjustment device which adjusts the temperature of the semiconductor laser and the solid state laser module to create a semiconductor laser excited solid state laser device wherein the solid state module is excited by the excitation light of the semiconductor laser; and (D) a step of controlling the semiconductor laser in the semiconductor laser excited solid state laser device such that the output light will be at the predetermined output level and controlling the temperature adjustment device such that the temperature of the semiconductor laser and the solid state laser module will be the set temperature.

Effect of the Invention

The present invention provides a semiconductor laser excited solid state laser device and laser light output method which outputs stable SHG light of low optical noise and reduces power consumption.

BRIEF DESCRIPTION OF THE DRAWINGS (FIG. 1) A schematic drawing illustrating the configuration of a semiconductor laser excited solid state laser device according to a mode of embodiment of the present invention.

(FIG. 2) A schematic drawing illustrating another configuration example of a solid state laser module according to a mode of embodiment of the present invention.

Figure 3:
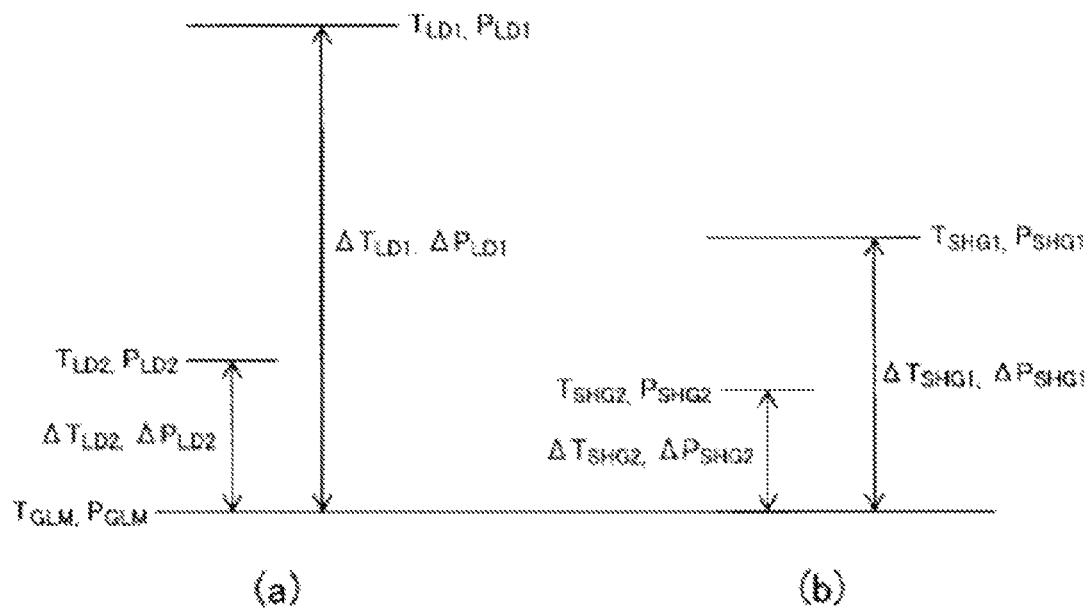

(FIG. 3) FIG. 3 (a) is a schematic drawing illustrating temperature and output level error for a semiconductor laser; FIG. 3 (b) is a schematic drawing illustrating temperature and output level error for a solid state laser module.

(FIG. 4) A graph illustrating the relationship between semiconductor laser wavelength and driving temperature.

(FIG. 5) A graph illustrating the relationship between semiconductor laser wavelength and output level.

(FIG. 6) A graph illustrating the relationship of solid state laser module SHG output intensity and optical noise intensity to temperature.

(FIG. 7) A schematic drawing illustrating the configuration of a semiconductor laser excited solid state laser device according to a modified example of a mode of embodiment of the present invention.

(FIG. 8) A schematic drawing illustrating a configuration example of a solid state laser module of a semiconductor laser excited solid state laser device according to another mode of embodiment of the present invention.

DETAILED DESCRIPTION OF THE EXEMPLARY EMBODIMENTS

Modes of embodiment of the present invention will be described with reference to the drawings. In the following description of the drawings, identical or similar reference symbols will be assigned to identical or similar parts. It should be noted that the drawings are of the schematic type. Furthermore, the modes of embodiment presented below illustrate a device and method for implementing the technical idea of this invention; the modes of embodiment of this invention do not limit the material shape, structure, arrangement, etc. of the component parts to those described below. The modes of embodiment of this invention can be modified in various ways within the scope of the patent claims.

The semiconductor laser excited solid state laser device 1 according to the mode of embodiment of the present invention, as shown in FIG. 1, comprises a semiconductor laser 10 which outputs an excitation light L1, a solid state laser module 30 which is excited by the excitation light L1 and generates an output light L2; and a single temperature adjustment device 40 which simultaneously adjusts the temperature of the semiconductor laser 10 and the temperature of the solid state laser module 30.

The semiconductor laser 10 is driven by a driving device 20, and outputs a single transverse mode excitation light L1 of a fixed wavelength at a specific set output level, without undergoing mode hopping, at a specific set temperature. The solid state laser module 30 has a maximum output efficiency at the aforementioned set temperature and outputs an output light L2 with optical noise at or below at fixed level. Output light L2 has a predetermined output level when the output level of the excitation light L1 is at the set output level.

In the semiconductor laser excited solid state laser device 1, the control device 50 controls the driving device 20 such that the output level L2 will be a predetermined output level, and controls the temperature adjustment device 40 such that the temperature of the semiconductor laser 10 and solid state laser module 30 will be a set temperature.

The excitation light L1 outputted from the semiconductor laser 10 is condensed by a condenser lens 15, and the condensed excitation light L1 is inputted into the solid state laser module 30. Solid state laser module 30 generates an output light L2 excited by the excitation light L1. The details of the solid state laser module 30 will be described later.

The output light L2 outputted from the solid state laser module 30 is split by a beam splitter 60. A portion of the split output light L2 is inputted into light receiving element 65 and is converted to an electrical signal. Light receiving element 65 transmits an electrical output signal $S_p$ corresponding to the output level of output light L2 to control device 50. A photodiode, for example, can be used as the light receiving element 65.

By receiving the output signal $S_p$, the control device 50 can monitor the output level of output light L2 in real time. The control device 50 controls the driving device 20 in order to adjust the output of excitation light L1 of semiconductor laser 10 such that the output level of output light L2 will be within a predetermined range.

As shown in FIG. 1, the semiconductor laser 10, solid state laser module 30 and temperature adjustment device 40 are mounted on a support platform 80. The temperature of the semiconductor laser 10 and the temperature of the solid state laser module 30 are adjusted by adjusting the temperature of the support platform 80 by means of the temperature adjustment device 40. A configuration employing a Peltier element, for example, can be used for the temperature adjustment device 40. Material of high thermal conductivity, for example, aluminum material or invar material, can be used for the support platform 80.

The temperature of the semiconductor laser 10 and the solid state laser module 30 is detected by a temperature detection device 70 attached to the support platform 80. The temperature detection device 70 transmits the detected temperature as an electrical temperature signal $S_T$ to the control device 50. A thermistor, for example, can be used for the temperature detection device 70.

By receiving the temperature signal $S_T$, the control device 50 is able to monitor the temperature of the semiconductor laser 10 and the solid state laser module 30 in real time. The control device 50 controls the temperature adjustment device 40 such that the temperature of the semiconductor laser 10 and solid state laser module 30 will be a predetermined set temperature.

The details of the solid state laser module 30 will be described below. The solid state laser module 30 comprises a laser crystal 31 which is excited by excitation light L1 and outputs an oscillation light, and a wavelength conversion crystal 32 which generates harmonic light of the oscillation light outputted by the laser crystal 31 and outputs that harmonic light as output light L2.

The laser crystal 31 is, for example, neodymium (Nd) doped yttrium vanadate (Nd:YVO4). Nd doped yttrium aluminum garnet (Nd:YAG), gadolinium vanadate (Nd:GcVO4), lithium yttrium fluoride (Nd:YLF) and the like can also be used for the laser crystal 31.

For the wavelength conversion crystal 32, for example, quasi phase matching crystal with a periodic polarization inversion structure formed in ferroelectric crystal can be used. Lithium tantalate (LT) crystal, lithium niobate (LN) crystal, or magnesium oxide (MgO) doped LT crystal or LN crystal is used for the wavelength conversion crystal 32.

For example, using Nd:YVO4 for the laser crystal 31, an oscillation light with a wavelength of about 1064 nm is excited by the excitation light L1 of the semiconductor laser 10. Here, the wavelength of the excitation light L1 of the semiconductor laser 10 is set to a wavelength of high absorption efficiency in the laser crystal 31, for example, about 809 nm. The oscillation light generated in the laser crystal 31 is wavelength-converted to second harmonic generation light (SHG light) with a wavelength of about 532 nm by the wavelength conversion crystal 32, and green output light L2 is outputted form the solid state laser module 30.

For the solid state laser module 30, a structure can be used wherein the laser crystal 31 and wavelength conversion crystal 32 are joined integrally by means of adhesive or an optical contact process, and a mirror coat is formed on the end face. The solid state laser module 30 shown in FIG. 1 is an example in which the laser crystal 31 and the wavelength conversion crystal 32, which is a quasi phase matching crystal, have been configured integrally. For the solid state laser module 30, a structure may also be employed wherein adhesive or an optical contact process is used to integrally join the laser crystal and wavelength conversion crystal, sandwiched by a dummy material, produced by the production method described in Japanese Unexamined Patent Application Publication 2007-225786.

Figure 2:
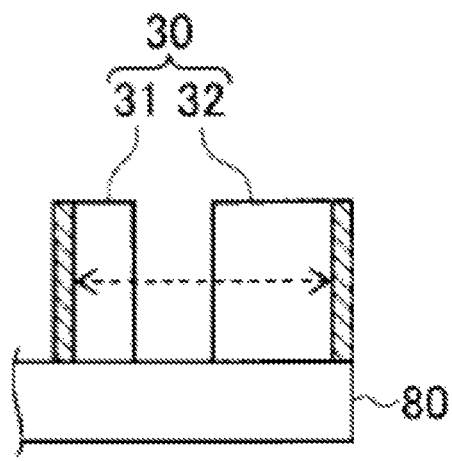

Alternatively, a structure may be employed wherein the laser crystal 31 and wavelength conversion crystal 32 are arranged on a resonator. FIG. 2 illustrates an example wherein the laser crystal 31 and wavelength conversion crystal 32 are arranged separately and the end faces on the outer sides thereof, indicated by hatching, are mirror coated to created resonators.

Furthermore, a solid state laser module 30 capable of single transverse mode oscillation can be implemented by using YVO4 laser crystal or wavelength conversion crystal of adequate width in relation to the oscillation gain amplitude of the YVO4 laser crystal, which has been machined to a thickness that provides a free spectral range (FSR) of 0.8 nm or greater, for example.

To select the semiconductor laser 10 and solid state laser module 30 to be used for the semiconductor laser excited solid state laser device 1, the wavelength and output level related characteristics are investigated as follows:

(A) Concerning the semiconductor laser, the range of temperature $T_{LD}$ is investigated, at which oscillation occurs at a predetermined wavelength, e.g. a wavelength of 809±0.5 nm, without producing mode hopping.
(B) Concerning the semiconductor laser, the range of output level $P_{LD}$ is investigated, at which oscillation occurs at a predetermined wavelength, e.g. 809±0.5 nm, without producing mode hopping.
(C) Concerning the solid state laser module, the range of temperature $T_{SHG}$ is investigated, at which the SHG output efficiency is high and the optical noise of SHG light is low.
(D) Concerning the solid state laser module, the range of output level $P_{SHG}$ of the excitation semiconductor laser is investigated, at which the desired output level of SHG light can be obtained.

The wavelength serving as reference for selecting the semiconductor laser 10 in item (A) is set such that output light L2 of the desired wavelength will be outputted from the solid state laser module 30. Here, the characteristics of the laser crystal 31 and the wavelength conversion crystal 32 are taken into consideration.

With regard to optical noise of SHG light, optical noise is considered to be low, for example, when it is at rms 1% or less. The reference rms value is stipulated arbitrarily depending on the required output characteristics of the semiconductor laser excited solid state laser device 1 and the like.

The semiconductor laser 10 and solid state laser module 30 used in the semiconductor laser excited solid state laser device 1 are selected in a combination such that there is a range where temperature $T_{LD}$ and temperature $T_{SHG}$ match and a range where output level $P_{LD}$ and output level $P_{SHG}$ match under a matching temperature range.

With regard to items (A) through (D), wavelength and output level are investigated based on "true values" which do not depend on the measurement device, or based on measured values using a measurement device.

However, there exist specific differences depending on a particular device between the settings values set in the semiconductor laser excited solid state laser device 1 and the true values or measured values obtained with respect to items (A) through (D). Thus, it is necessary to select the semiconductor laser 10 and solid state laser module 30 while taking these differences into consideration.

For the semiconductor laser 10, the relationship between the true temperature $T_{LD1}$, the measured temperature $T_{LD2}$ and the set temperature $T_{GLM}$, and the relationship between the true output level $P_{LD1}$, the measured output level $P_{LD2}$ and the set output level $P_{GLM}$ are shown in FIG. 3 (a). In FIG. 3 (a), the difference between the true temperature $T_{LD1}$ and the set temperature $T_{GLM}$ is expressed as $\Delta L_{TD1}$, and the difference between measured temperature $T_{LD2}$ and set temperature $T_{GLM}$ is represented as $\Delta T_{LD2}$. Furthermore, the difference between the true output level $P_{LD1}$ and set output level $P_{GLM}$ is represented as $\Delta P_{LD1}$, and the difference between the measured output level $P_{LD2}$ and set output level $P_{GLM}$ is represented as $P_{LD2}$.

Furthermore, with regard to the solid state laser module 30, the relationship between the true temperature $T_{SHG1}$, the measured temperature $T_{SHG2}$ and the set temperature $T_{GLM}$ and the relationship between the true output level $P_{SHG1}$, the measured output level $P_{SHG2}$ and the set output level $P_{GLM}$ are shown in FIG. 3 (b). In FIG. 3 (b), the difference between the true temperature $T_{SHG1}$ and the set temperature $T_{GLM}$ is represented as $\Delta T_{SHG1}$, and the difference between the measured temperature $T_{SHG2}$ and set temperature $T_{GLM}$ is represented as $\Delta T_{SHG2}$. Furthermore, the difference between the true output level $P_{SHG1}$ and set output level $P_{GLM}$ for the excitation semiconductor laser is represented as $\Delta P_{SHG1}$ and the difference between the measured output level $P_{SHG2}$ and the set output level $P_{GLM}$ is represented as $\Delta P_{SHG2}$.

The set temperature $T_{GLM}$ and set output level $P_{GLM}$ taking into consideration the specific differences shown in FIG. 3 (a) and FIG. 3 (b) are represented by the following formulas (1) through (8).

With regard to the semiconductor laser 10, when the true value is known:

$$T_{GLM} = T_{LD1} - \Delta T_{LD1} \quad (1)$$

$$P_{GLM} = P_{LD1} - \Delta P_{LD1} \quad (2)$$

With regard to the semiconductor laser 10, if the measured value has been obtained using measurement device A:

$$T_{GLM} = T_{LD2} - \Delta T_{LD2} \quad (3)$$

$$P_{GLM} = P_{LD2} - \Delta P_{LD2} \quad (4)$$

With regard to the solid state laser module 30, when the true value is known:

$$T_{GLM} = T_{SHG1} - \Delta T_{SHG1} \quad (5)$$

$$P_{GLM} = P_{SHG1} - \Delta P_{SHG1} \quad (6)$$

With regard to the solid state laser module 30, if the measured value has been obtained using measurement device B:

$$T_{GLM} = T_{SHG2} - \Delta T_{SHG2} \quad (7)$$

$$P_{GLM} = P_{SHG2} - \Delta P_{SHG2} \quad (8)$$

For example, it will be assumed that the wavelength of the excitation light L1 outputted by semiconductor laser 10 is 809±0.5 nm, and that it was ascertained through measurement using measurement device A that the temperature range in which mode hopping does not occur at this wavelength is $T1_{LD1}$ through $T2_{LD1}$, and the corresponding output value range is $P1_{LD1}$ through $P2_{LD1}$. In this case, the range "$T1_{GLM}$ through $T2_{GLM}$" of set temperature $T_{GLM}$ and the range "$P1_{GLM}$ through $P2_{GLM}$" of set output level $P_{GLM}$ are determined based on formula (1) through formula (4). The solid state laser module 30 which can be combined with a semiconductor laser 10 having these characteristics needs to satisfy the relationships of the following formulas (9) through (10) when the true value is known, based on formulas (5) through (6):

$$T1_{GLM}+\Delta T_{SHG1}<T_{SHG1}<T2_{GLM}+\Delta T_{SHG1} \quad (9)$$

$$P1_{GLM}+\Delta P_{SHG1}<P_{SHG1}<P2_{GLM}+\Delta P_{SHG1} \quad (10)$$

Alternatively, a solid state laser module 30 which satisfies the relationships of formulas (11) through (12) is selected based on formulas (7) through (8) using measured values obtained with measurement device B.

$$T1_{GLM}+\Delta T_{SHG2}<T_{SHG2}<T2_{GLM}+\Delta T_{SHG2} \quad (11)$$

$$P1_{GLM}+\Delta P_{SHG2}<P_{SHG2}<P2_{GLM}+\Delta P_{SHG2} \quad (12)$$

The solid state laser module 30 can be selected based on parameters relating to the semiconductor laser 10 as described above. Alternatively, the semiconductor laser 10 which can be combined with the solid state laser module 30 may be selected based on parameters relating to the solid state laser module 30.

The method of selecting the semiconductor laser 10 and solid state laser module 30 using measured values will be described more concretely below.

For example, in order to obtain green output light L2 as the SHG light, the wavelength of the excitation light L1 outputted by the semiconductor laser 10 is set to 809±0.5 nm, for which the absorption efficiency in the solid state laser module 30 is high. Furthermore, measurements are performed on the oscillation wavelength centered on the set wavelength, and the range of set temperature $T_{GLM}$ and set output level $P_{GLM}$ is determined.

Specifically, the output level is kept constant and the driving temperature is varied, and the oscillation wavelength of the semiconductor laser being investigated is measured using a light spectrum analyzer or the like. For example, the output level is set at 120 mW, and measurement is performed at 1° C. intervals of driving temperature. The set value of the output level during measurement is set, for example, to an output level which is frequently used in the semiconductor laser excited solid state laser device 1. The difference $\Delta T_{LD2}$ between the set value and the measured value of the driving temperature is for example −2° C. To facilitate the selection of semiconductor laser 10, it is preferable to perform measurements in advance in the range of about ±10 mV from an output level frequently used in the semiconductor laser excited solid state laser device 1.

Figure 4:
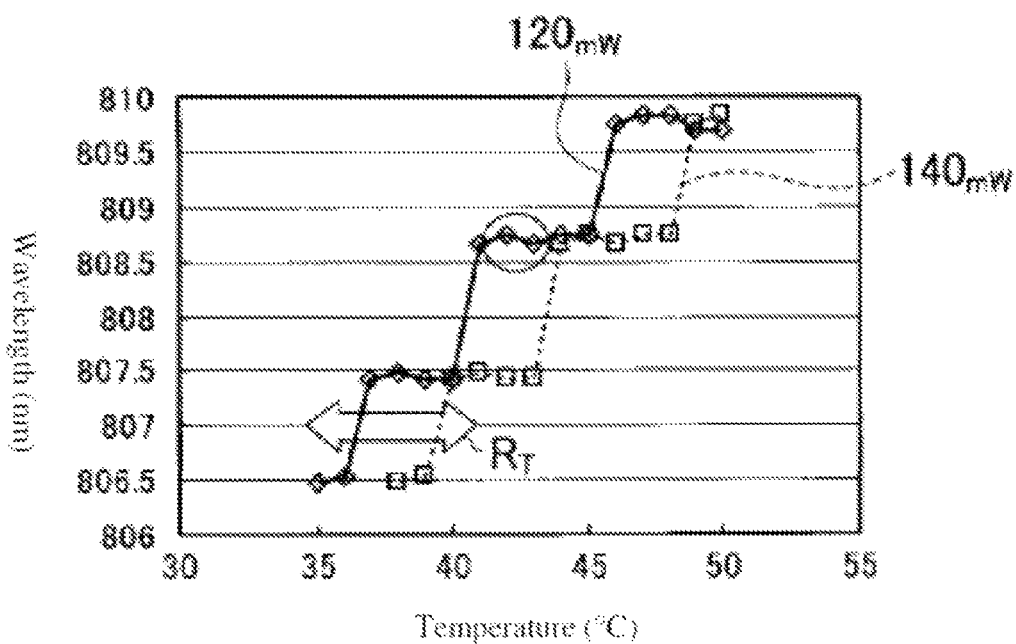

FIG. 4 shows the result of measuring the relationship to temperature for wavelength shift and mode hopping of a semiconductor laser 10. In the example shown in FIG. 4, when the output level of the semiconductor laser 10 is 120 mW, excitation light with a wavelength of 808.7 nm is outputted without mode hopping in the range where the temperature indicated by the circle in FIG. 4 is 42° C. to 44° C. When the error $\Delta T_{LD2}$ due to the measurement device A used for measurement is 2° C., the range of set temperature $T_{GLM}$ of the semiconductor laser excited solid state laser device 1 based on measurement of semiconductor laser 10 is 40° C. to 42° C.

The arrow $R_T$ shown in FIG. 4 indicates that the wavelength characteristic shifts in the high temperature direction when the output level is increased and that the wavelength characteristic shifts in the low temperature direction when the output level is reduced. Namely, it is not possible to obtain the desired oscillation wavelength characteristic through temperature setting alone.

Thus, the driving temperature is kept constant and the output level is varied and the oscillation wavelength of the semiconductor laser to be investigated is measured using a light spectrum analyzer or the like. For example, the driving temperature is set near 40° C. and measurement is performed at 10 mW intervals of output level. The difference $\Delta T_{LD2}$ between the set value and measured value of driving temperature is for example −2° C.

Figure 5:
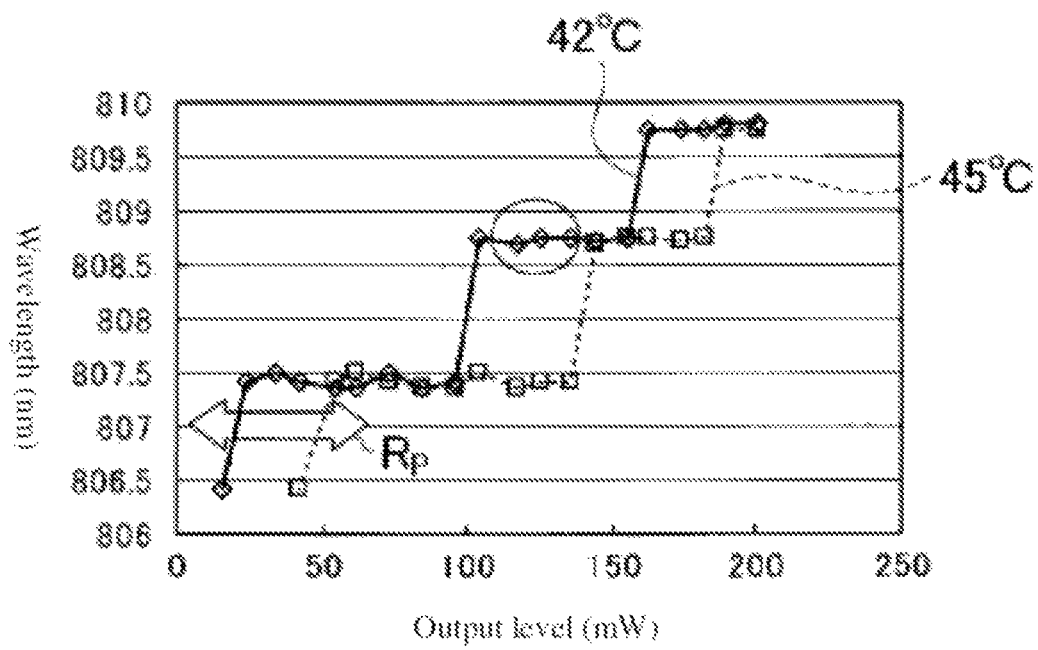

FIG. 5 shows the results of measuring the relationship between output level and wavelength for wavelength shift and mode hopping of semiconductor laser 10. In the example shown in FIG. 5, when the temperature of the semiconductor laser 10 is 42° C., excitation light with a wavelength of 808.7 nm is outputted without mode hopping in the output level range of 110 mW to 140 mW shown by a circle in FIG. 5. When the error $\Delta P_{LD2}$ due to the measurement device A used for measurement is 0 mW, the range of the set output level $P_{GLM}$ of the semiconductor laser 10 is 110 mW to 140 mW.

The arrow $R_P$ shown in FIG. 5 indicates that the wavelength characteristic shifts in the high output direction when the temperature is increased and that the wavelength characteristic shifts in the low output direction when the temperature is reduced. Namely, it is possible to confirm whether the setting provides the desired oscillation wavelength without occurrence of mode hopping by measuring both the driving temperature and output level as parameters associated with the wavelength characteristic.

For the solid state laser module 30, the following measurement is performed. Namely, the driving temperature and output level of the excitation semiconductor laser are kept constant and the temperature of the solid state laser module to be investigated is varied, and the SHG light output level and optical noise are measured. For example, measurement is performed at 1° C. temperature intervals of the solid state laser module being investigated, and the difference $\Delta T_{SHG2}$ between the measured value and set value of the temperature is taken to be −1° C. The characteristics of the solid state laser module being investigated are measured by means of a measurement device provided with a separate temperature adjustment device for the solid state laser module being investigated and for the excitation semiconductor laser. The driving temperature and output level of the excitation semiconductor laser are set to values which allow the desired output level to be obtained for SHG light. Here, the excitation semiconductor laser is adjusted to a driving temperature and output level which do not produce mode hopping at the wavelength of maximum absorption efficiency in the solid state laser module.

Figure 6:
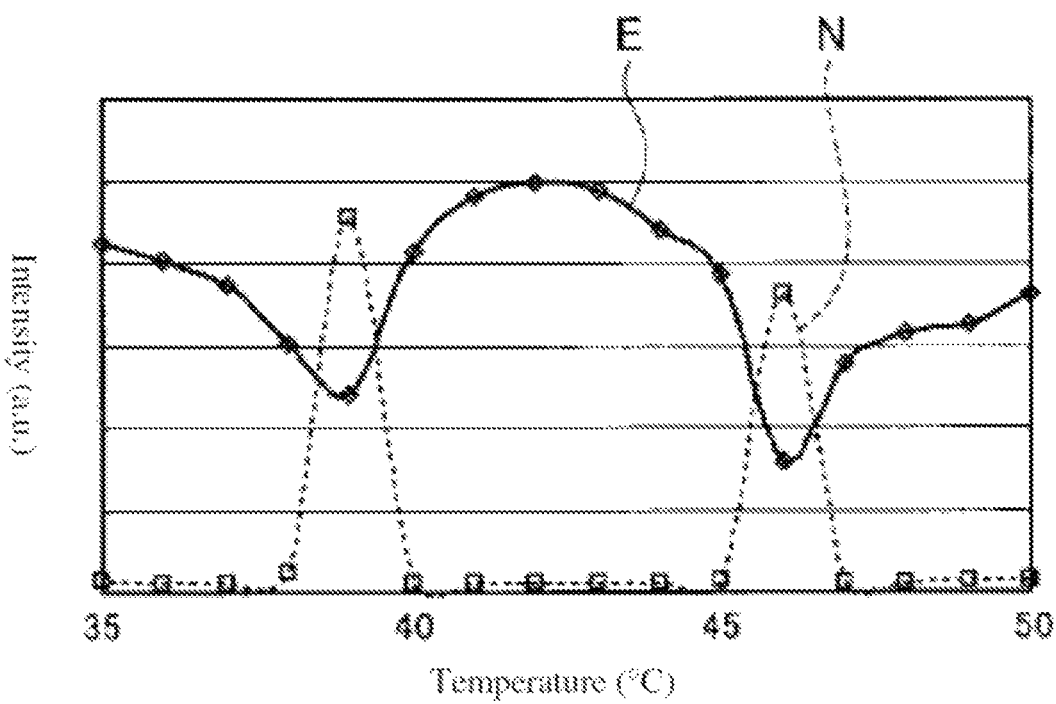

FIG. 6 shows the results of measuring SHG output E and the intensity of optical noise N versus temperature of solid state laser module 30 at 809±0.5 nm oscillation wavelength of the excitation semiconductor laser, fixed at driving parameters at which mode hopping does not occur. In the example shown in FIG. 6, it can be determined that, when the temperature of the solid state laser module 30 is 42° C., the efficiency of SHG output E is maximum, the optical noise N is low and the characteristic is good. When the error $\Delta T_{SHG2}$ due to the measurement device B used for measurement is 1° C., the set temperature $T_{GLM}$ of the semiconductor laser excited solid state laser device 1 based on measurement of the solid state laser module 30 is 41° C.

Furthermore, if the desired SHG output level can be obtained when the output level of the excitation semiconductor laser is 120 mW in the solid state laser module 30 for which the characteristic is shown in FIG. 6, the semiconductor laser 10 for which the characteristic is shown in FIG. 4 through FIG. 5 and the solid state laser module 30 for which the characteristic is shown in FIG. 6 are a combination which satisfies the following matching conditions. Namely, the matching conditions of excitation light L1 wavelength 808.7 nm, set temperature $T_{GLM}$ 41° C., no mode hopping, are satisfied. Here, "matching conditions" refer to the overlapping portion of the selection conditions for the semiconductor laser 10 and the selection conditions for the solid state laser module 30. The combination of semiconductor laser 10 and solid state laser module 30 which satisfies the matching conditions is selected as a constituent element used in the semiconductor laser excited solid state laser device 1.

As explained above, using measurement results, for example, a combination of semiconductor laser 10 and solid state laser module 30 is selected which satisfies the conditions of set temperature $T_{GLM}$ range and the conditions of set output level $P_{GLM}$ range with regard to a set temperature $T_{GLM}$ range with good SHG output efficiency and low optical noise of the solid state laser module 30 and a set output level $P_{GLM}$ of the semiconductor laser 10 which allows the desired SHG output level to be obtained. A semiconductor laser excited solid state laser device 1 having the desired characteristics can be created using the selected semiconductor laser 10 and solid state laser module 30.

It will be noted that it is preferable to select a combination of semiconductor laser 10 and solid state laser module 30 which satisfies the matching conditions also in the vicinity (e.g. within about ±10 mW) of the driving temperature and output level of the semiconductor laser 10 which satisfy the matching conditions and in the vicinity (e.g. within about ±2° C.) of the temperature which satisfies SHG output efficiency and optical noise characteristic conditions of the solid state laser module 30. As a result, even if there is substantial external interference with regard to the temperature of the operating environment and the like, the output light L2 of the semiconductor laser excited solid state laser device 1 will not be readily affected thereby and will be able to maintain stable characteristics.

Figure 7:
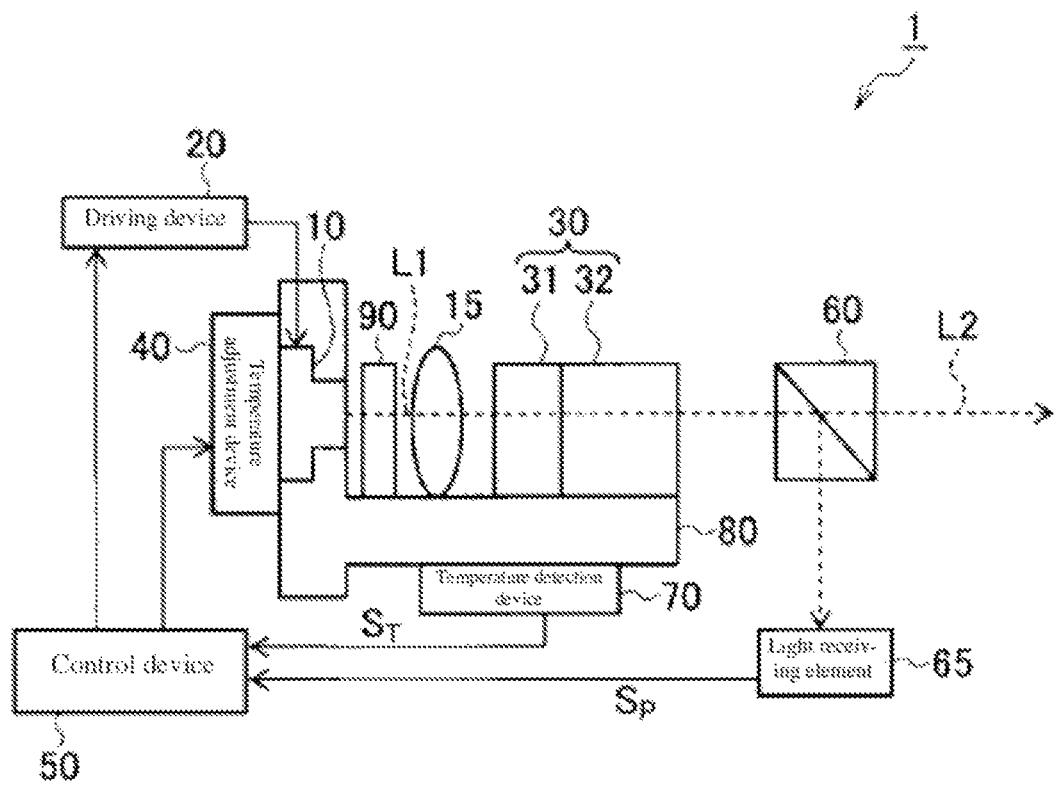

FIG. 7 shows a modified example of semiconductor laser excited solid state laser device 1 which additionally comprises an optical isolator 90. The optical isolator 90 makes it possible to suppress the generation of optical noise due to return light going to the semiconductor laser 10. The optical isolator 90 is arranged between the semiconductor laser 10 and the solid state laser module 30. FIG. 7 shows an example where the optical isolator 90 has been arranged between the semiconductor laser 10 and the condenser lens 15, but the optical isolator 90 may also be arranged between the condenser lens 15 and the solid state laser module 30.

A semiconductor laser 10 having transverse mode as the single mode has a low oscillation threshold and high electro-optical conversion efficiency, making it possible to reduce the driving current. Furthermore, since the electro-optical conversion efficiency is high, the heat generation of the semiconductor laser 10 is low, making it possible to reduce the power required for temperature control. Thus, it is possible to use the semiconductor laser excited solid state laser device 1 portably, for example, with dry cell driving.

However, in a single transverse mode semiconductor laser, depending on the driving conditions, mode hopping occurs at about 1 nm between adjacent transverse modes. It is known that the output of the solid state laser module becomes unstable if the excitation semiconductor laser used undergoes mode hopping for this reason. This mode hopping is caused not just by the temperature of the excitation semiconductor laser but also by the output settings parameters. Thus, to prevent the occurrence of mode hopping, it is necessary to control both the temperature and the output level of the excitation semiconductor laser.

Furthermore, when using a single transverse mode oscillation solid state laser module, mode hopping occurs between transverse modes due to temperature. This phenomenon causes output light to be unstable and generates optical noise even in a laser device comprising an automatic power control (APC) circuit.

However, in the semiconductor laser excited solid state laser device 1 according to the mode of embodiment, the characteristics which should be satisfied by the semiconductor laser 10 and the solid state laser module 30 have been investigated in advance and a combination of semiconductor laser 10 and solid state laser module 30 which satisfies those characteristics has been selected.

Generally, the semiconductor laser 10 and solid state laser module 30 have variability of wavelength characteristics and laser characteristics between production lots or within a production lot. Thus, assembly of the semiconductor laser excited solid state laser device 1 is facilitated by selecting a semiconductor laser 10 and solid state laser module 30 which can be used based on their individual characteristics which have been investigated in advance.

Furthermore, by using the selected semiconductor laser 10 and solid state laser module 30 and controlling the semiconductor laser 10 and solid state laser module 30 so as to maintain the set temperature $T_{GLM}$ and the set output level $P_{GLM}$, good stability of optical noise and other output characteristics can be achieved and power consumption can be reduced in a semiconductor laser excited solid state laser device 1 using a single temperature adjustment configuration. Namely, by employing a single temperature adjustment configuration, it is possible to achieve miniaturization and reduced power consumption and implement a semiconductor laser excited solid state laser device 1 with good output characteristics.

(Other Modes of Embodiment)

The present invention was described by means of a mode of embodiment above, but the description and drawings constituting this portion of the disclosure should not be understood as limiting the invention. Based on this disclosure, various substitute modes of embodiment, examples of embodiment and application technologies should be evident to those skilled in the art.

Figure 8:
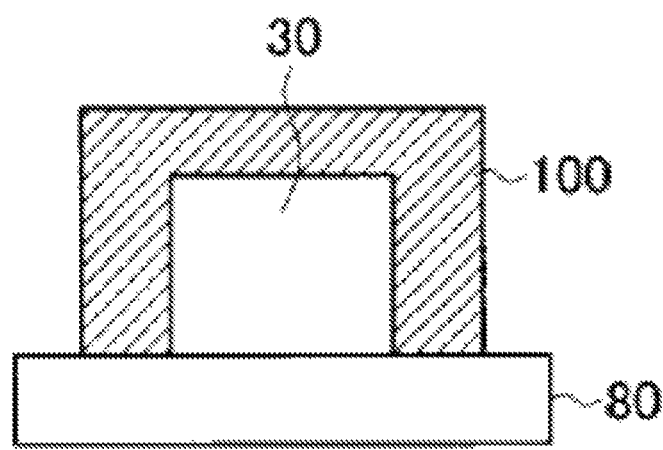

For example, providing a heat sink material on the solid state laser module 30 makes it easier to dissipate heat generated from the laser crystal 31. As a result, it is possible to efficiently obtain output laser light from the laser crystal 31. FIG. 8 shows an example in which the area around the solid state laser module 30 has been covered with a heat sink material 100. FIG. 8 is a drawing viewed from the optical axis direction of output light L2. Silicon (Si) material and copper (Cu) material with a thermal conductivity equal to or greater than that of glass can be used for the heat sink material 100.

It is thus obvious that the present invention includes various modes of embodiment, etc. which have not been described here. Therefore, the technical scope of the present invention is determined solely by the specifying features of the invention according to the scope of patent claims, as appropriate in light of the foregoing description.

EXPLANATION OF REFERENCES

1 . . . Semiconductor laser excited solid state laser device
10 . . . Semiconductor laser
15 . . . Condenser lens
20 . . . Driving device 30 . . . Solid state laser module
31 . . . Laser crystal
32 . . . Wavelength conversion crystal
40 . . . Temperature adjustment device
50 . . . Control device
60 . . . Beam splitter
65 . . . Light receiving element
70 . . . Temperature detection device
80 . . . Support platform
90 . . . Optical isolator
100 . . . Heat sink material
L1 . . . Excitation light
L2 . . . Output light

What is claimed is:

1. A semiconductor laser excited solid state laser device, comprising:
    a semiconductor laser which outputs a single transverse mode excitation light of fixed wavelength at a set output level, without undergoing mode hopping, at a set temperature;
    a driving device which drives said semiconductor laser;
    a solid state laser module which has maximum output efficiency at said set temperature and which generates, from said excitation light, an output light of a predetermined output level when an optical noise is at or below a fixed level and the output level of said excitation light is said set output level;
    a single temperature adjustment device which adjusts the temperature of said semiconductor laser and the temperature of said solid state laser module; and
    a control device which controls said driving device such that said output light will be at said predetermined output level without undergoing mode hopping based on wavelength shift characteristics of said semiconductor laser dependent on output level, and controls said temperature adjustment device such that the temperature of said semiconductor laser and said solid state laser module will be said set temperature without undergoing mode hopping based on wavelength shift characteristics of said semiconductor laser dependent on temperature.

2. The semiconductor laser excited solid state laser device described in claim 1, wherein said solid state laser module comprises:
    a laser crystal which is excited by said excitation light and outputs an oscillation light; and
    a wavelength conversion crystal which generates harmonic light of said oscillation light and outputs that harmonic light as said output light.

3. The semiconductor laser excited solid state laser device described in claim 2, wherein said laser crystal and said wavelength conversion crystal are of an integral structure.

4. The semiconductor laser excited solid state laser device described in claim 2, wherein said wavelength conversion crystal is a quasi phase matching crystal having a periodic polarization inversion structure.

5. The semiconductor laser excited solid state laser device described in claim 2, wherein said laser crystal is neodymium doped yttrium vanadate.

6. The semiconductor laser excited solid state laser device described in claim 1, wherein the wavelength of said excitation light at said set temperature is the wavelength at which the absorption efficiency in said solid state laser module is maximum.

7. A laser light output method, comprising:
    selecting a semiconductor laser which outputs a single transverse mode excitation light of fixed wavelength at a set output level, without undergoing mode hopping, at a set temperature;
    selecting a solid state laser module which has maximum output efficiency at said set temperature and which generates, from said excitation light, an output light of a predetermined output level when an optical noise is at or below a fixed level and the output level of said excitation light is said set output level;
    using the selected semiconductor laser and the selected solid state laser module and a single temperature adjustment device which adjusts the temperature of said semiconductor laser and said solid state laser module to create a semiconductor laser excited solid state laser device wherein said solid state module is excited by the excitation light of said semiconductor laser; and
    controlling said semiconductor laser in said semiconductor laser excited solid state laser device such that said output light will be at said predetermined output level without undergoing mode hopping based on wavelength shift characteristics of said semiconductor laser dependent on output level, and controlling said temperature adjustment device such that the temperature of said semiconductor laser and said solid state laser module will be said set temperature without undergoing mode hopping based on wavelength shift characteristics of said semiconductor laser dependent on temperature.

8. The laser light output method described in claim 7, wherein said semiconductor laser is selected in consideration of the difference between said set temperature and the temperature of said semiconductor laser at the time of selection.

9. The laser light output method described in claim 8, wherein said solid state laser module is selected in consideration of the difference between said set temperature and the temperature of said solid state laser module at the time of selection.

* * * * *